United States Patent [19]

Verdier

[11] Patent Number: 4,891,592
[45] Date of Patent: Jan. 2, 1990

[54] NUCLEAR MAGNETIC RESONANCE MAGNETOMETER

[75] Inventor: Robert Verdier, Barbieres, France

[73] Assignee: Crouzet (Société Anonyme francaise), Montrouge, France

[21] Appl. No.: 207,918

[22] Filed: Jun. 10, 1988

[30] Foreign Application Priority Data

Jun. 11, 1987 [FR] France .................................. 87 08172

[51] Int. Cl.⁴ ............................................. G01R 33/24
[52] U.S. Cl. .................................................... 324/301
[58] Field of Search .............. 324/300, 301, 302, 308, 324/318, 322

[56] References Cited

U.S. PATENT DOCUMENTS

| | | | |
|---|---|---|---|
| 3,145,336 | 8/1964 | Bonnet | 324/301 |
| 3,239,752 | 3/1966 | Greenwood, Jr. | 324/301 |
| 3,735,246 | 5/1973 | Glenat et al. | 324/301 |
| 4,734,645 | 3/1988 | Glenat et al. | 324/301 |

FOREIGN PATENT DOCUMENTS

| | | |
|---|---|---|
| 0206931 | 12/1986 | European Pat. Off. |
| 1009858 | 11/1965 | United Kingdom |
| 1210840 | 11/1970 | United Kingdom ................. 324/301 |

OTHER PUBLICATIONS

Kurashov, Sadydov and Tarasov, "A Follow-Up Magnetometer Based on An E11-2 Magnetic Field Meter", 8164 *Instruments and Experimental Techniques*, vol. 18, No. 4, part 2 (Jul. 8, 1973): 1306, 1308.

Primary Examiner—Michael J. Tokar
Assistant Examiner—Louis M. Arana
Attorney, Agent, or Firm—Lowe, Price, LeBlanc, Becker & Shur

[57] ABSTRACT

A nuclear magnetic resonance magnetometer is provided comprising two semi-coils which pick up precessional signals of the nuclear spins of two samples. A capacitor of a battery of capacitors forms a resonating circuit with the two semi-coils. The signal at the terminals of the capacitor is amplified in a differential amplifier, phase-shifted in a phase-shifter introducing a constant phase-shift of 90°, and reinjected into the semi-coils through a potentiometer. The frequency of the oscillations is measured by a frequency meter. A circuit controls the connection of the capacitors of the battery is response to the valve of the frequency measured so as to maintain the parasite phase-shifts between signals picked up and reinjected signals less than a threshold.

3 Claims, 2 Drawing Sheets

NUCLEAR MAGNETIC RESONANCE MAGNETOMETER

The present invention relates to a nuclear magnetic resonance magnetometer comprising two semi-coils for picking up and reinjecting precessional signals of the nuclear spins of two samples of a material having gyromagnetic properties, disposed in the magnetic field to be measured and energized by a VHF generator, a capacitor connected to the terminals of the two semi-coils, a differential amplifier connected to the terminals of the capacitor, a phase-shifter connected to the output of the differential amplifier, means for reinjecting into each semi-coil a current controlled by the output signal from the phase-shifter, and a frequency meter for measuring the frequency of the oscillations of the oscillator thus formed, which frequency is proportional to the magnetic field to be measured.

Such magnetometers are described in French Pat. Nos. 1 447 226 of 20th Apr., 1965 and 2 098 624 of 14th Feb., 1972, particularly insofar as the double effect technique is concerned making it possible, through a suitable choice of the materials, to obtain reversed biasing for each sample for the same electronic spectral line energization frequency.

But this type of magnetometer has drawbacks.

Firstly, the natural selectivity of the resonating circuit comprising the semi-coils and the capacitor limits the exploration range of the magnetometer which cannot extend over the whole range of the earth's magnetic field.

Secondly, when the Larmor frequency diverges from the tuning frequency of the oscillator circuit, parasite phase-shifts are introduced between the signals picked up and the signals reinjected, which result in shifting the frequency of the oscillator, that is to say that this latter is no longer strictly equal to the Larmor frequency. A measurement error results therefrom.

Finally, such a magnetometer is sensitive to temperature variations and to the attitude variations of the sample with respect to the magnetic field to be measured.

The purpose of the present invention is to overcome these drawbacks by providing a magnetometer of the above defined type, which makes it possible to make measurements, over the whole range of the earth's magnetic field, which are more precise than with magnetometers of the prior art.

For this, the invention provides a magnetometer of the above defined type, characterized by the fact that the phase-shift is adapted so as to introduce a constant phase-shift equal to 90° over the whole frequency range of the oscillations, the capacitor forming part of a battery of capacitors and means are provided for controlling the switching of the capacitors of the battery, in response to the value of the frequency measured by the frequency meter, so that the parasite phase-shifts between the signals picked up and the signals reinjected into the two semi-coils always remain less than a threshold.

In the magnetometer of the invention, because the phase-shifter introduces no parasite phase-shift, the overall parasite phase-shift is kept lower than a threshold compatible with the desired measurement accuracy, by switching the capacitors of the battery so that the tuning frequency of the resonating circuit remains permanently close to the Larmor frequency. The range inside which the measurements are accurate is therefore much more extensive than in prior art magnetometers.

Advantageously, at the output of the phase-shifter a controllable gain amplifier is provided connected to a temperature sensor, for causing the level of the reinjected signals to vary as a function of the temperature.

Thus, the influence of the temperature is taken into account and the accuracy of the measurements made is independent of the temperature.

Again advantageously, a sensor is provided for determining the attitude of the sample with respect to the magnetic field to be measured, as well as a controllable gain amplifer at the output of the phase-shifter, controlled by said attitude sensor and the VHF generator is power controllable, controlled by said attitude sensor.

Thus, account is taken of the influence of the orientation of the samples, with respect to the magnetic field to be measured, and the accuracy of the measurements made is independent of this orientation.

The present invention will be better understood from reading the following description of the preferred embodiment of the magnetometer of the invention, with reference to the accompanying drawings in which.

Figure 1:
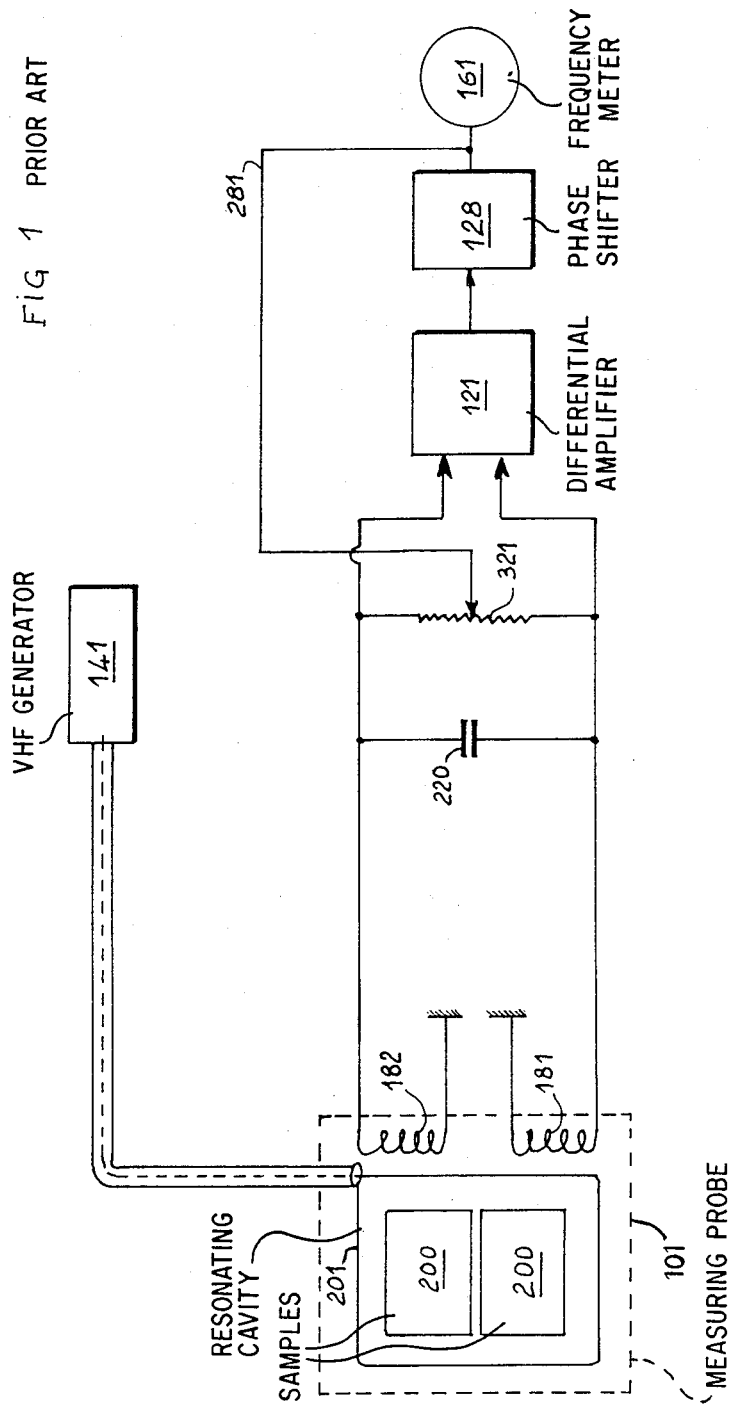
FIG. 1 shows a prior art magnetometer.

Referring to FIG. 1, a magnetometer comprises a measuring probe 101 placed in the magnetic field to be measured.

The measuring probe 101 comprises two semi-coils 181 and 182, wound concentrically, in a way not shown but which is known, about two samples 200 of a material having gyromagnetic properties, in this case a solvent comprising atomic nuclei with non-zero magnetic moment and kinetic moment, and a paramagnetic substance in stable solution (free radical comprising an unpaired electron interacting with an atomic nucleus of the substance).

These samples 200 are surrounded by a resonating cavity 201, providing dynamic biasing of the nuclei of the material and fed by a VHF generator 141, whose very high frequency and power are fixed, for exciting electronic resonance spectral rays of samples 200.

The two semi-coils 181 and 182 pick up and reinject precession signals of the nuclear spins, for maintaining oscillations at the Larmor frequency. Each semi-coil 181 and 182 has one end connected to ground, the other end being connected to one of the plates of a capacitor 220. Capacitor 220 and the two semi-coils 181 and 182 form a resonating circuit in which an electromotive force is induced by the spins at the Larmor frequency, and amplified by the selectivity of the circuit.

A differential amplifier 121 amplifies the signal at the terminals of capacitor 220. It is followed by a phase-shifter 128, of LC type, which shifts the phase of the output signal of amplifier 121 by 90° when the amplifier is at the tuning frequency of the resonating circuit. The output signal of the phase-shifter 128 is relooped, by a line 281, to the slider of a potentiometer 321 whose resistance is connected in parallel across the capacitor 220, for reinjecting symmetrical currents into each semi-coil 181 and 182. The oscillations of the oscillator thus formed are thus sustained.

A frequency meter 161, for measuring the frequency of the oscillations, makes it possible to know the value of this frequency, and to derive therefrom the value of the magnetic field to be measured, proportional to this frequency.

Such a magnetometer has the drawback of a limited measurement range because, when the oscillating circuit and the LC phase-shifter are not strictly tuned to the Larmor frequency to be measured, parasite phase-shifts are introduced between the electromotive force induced in the semi-coils 181 and 182 and the current re-injected by potentiometer 321, which results in shifting the frequency, i.e. the frequency of the oscillations measured by the frequency meter apparatus 161 differs from the Larmor frequency.

Figure 2:
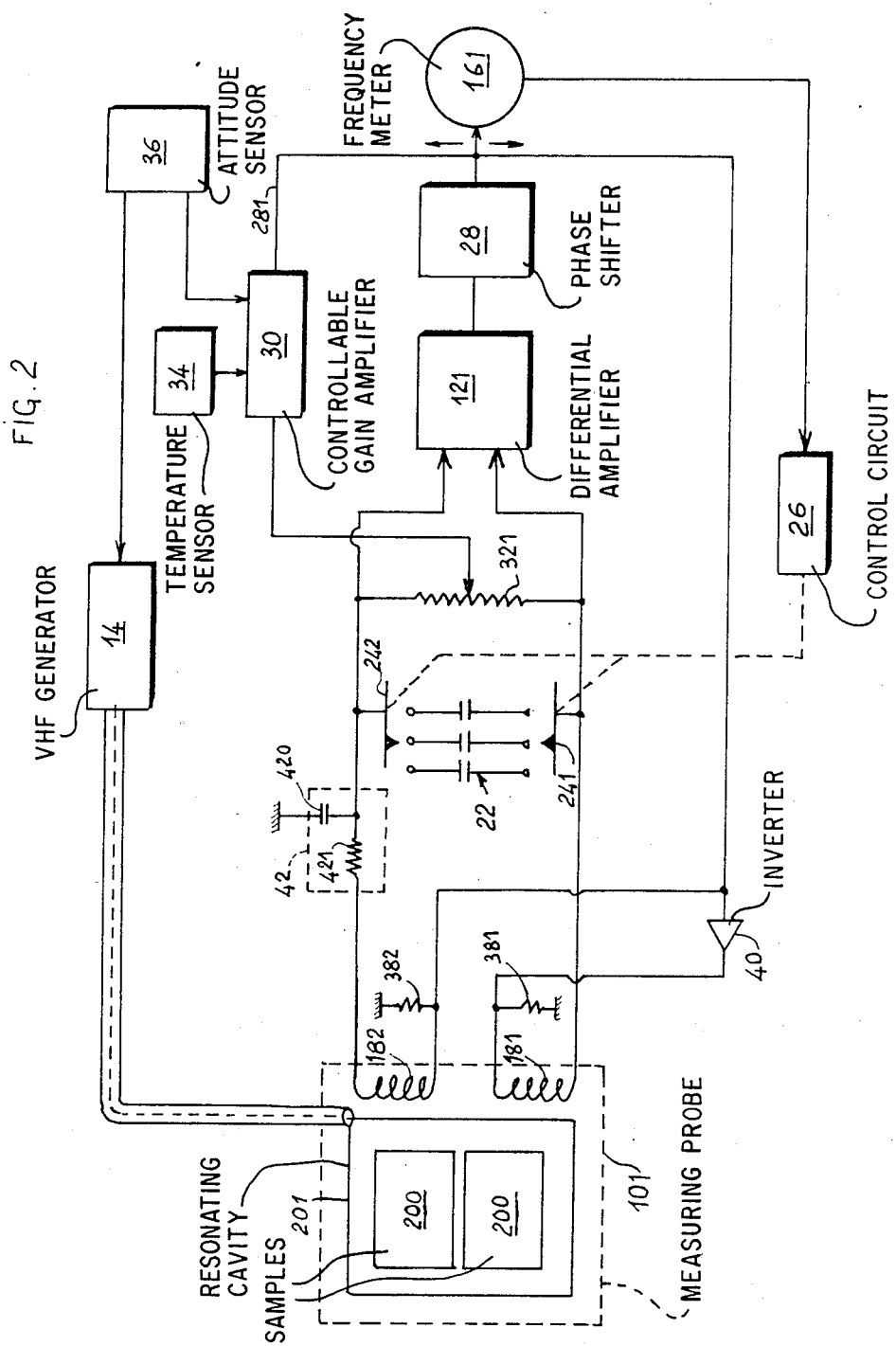
FIG. 2 shows a magnetometer in accordance with the invention.

Referring now to FIG. 2, the magnetometer of the invention comprises a probe 101 with a cavity 201, two samples 200 and two semi-coils 181 and 182 identical to those of FIG. 1.

The cavity 201 is energized by a VHF generator 14, comparable to VHF generator 141 of FIG. 1 but whose power is controllable, as will be understood hereafter.

Each semi-coil 181 and 182 has a first end connected to ground through a very low value resistance 381 and 382 respectively. The second end of coil 181 is connected to the movable contact of a multi-position switch 41. The second end of coil 182 is connected to the movable contact of a multi-position switch 242, through a correction cell 42 whose purpose will be better understood hereafter.

The two switches 241 and 242 are coupled and controlled simultaneously by a control circuit 26 for controlling the connection, between the two second ends of the semi-coils 181 and 182, of any one of the capacitors of a battery 22 of capacitors, disposed between the fixed contacts of switches 241 and 242. By capacitor "battery" is meant here a plurality or else a series of capacitors.

A differential amplifier 121, similar to that of FIG. 1, amplifies the signal at the terminals of the capacitor of battery 22 which is in service. It is followed by a phase-shifter 28, here of the controlled active type, providing a constant 90° phase-shift +/−1° whatever the frequency. The output signal from phase-shifter 28 is relooped, through a line 281 and a controllable gain amplifier 30, to the slider of a potentiometer 321 whose resistance is connected in parallel across a capacitor of battery 22 which is in service. Line 281 and potentiometer 321 are similar to those of FIG. 1.

A frequency meter 161 for measuring the frequency of the oscillations, similar to that shown in FIG. 1, makes it possible to know the value of this frequency, for deriving therefrom the value of the magnetic field to be measured. It delivers to the control circuit 36 a signal representative of the value of the frequency measured.

A sensor 34, for measuring the temperature, controls the gain of amplifier 30, in a way which will be better undrestood hereafter.

A sensor 36, for determining the attitude of the measurement probe 101 with respect to the magnetic field to be measured, controls both the gain of amplifer 30 and the power of the VHF generator 14.

The output signal from phase-shifter 28 is applied directly to the junction point between the semi-coil 182 and resistor 382 and, through a unitary gain inverter 40, to the junction point between the semi-coil 181 and resistor 381.

The magnetometer of FIG. 2, whose structure has just been described, operates in the following way.

The control circuit 26 is here a computer, which, in response to the value of the frequency measured by the frequency meter 161, controls the connection of one of the capacitors of battery 22. For this, the total range of oscillation frequencies to be measured, which typically extends from 1000 to 3000 Hz is divided into a number of jointing sub-ranges, each sub-range corresponding to a given capacitor of battery 12. Thus, the sub-range of rank n is centered on the central frequency $F_n$, and extends from the minimum frequency $F_{n-1,n}$ to the maximum frequency $F_{n,n+1}$. To this range is assigned a capacitor $C_n$ of battery 12 whose value is determined so that the resonating circuit formed by capacitor $C_n$ and the two semi-coils 181 and 182 is tuned to the frequency $F_n$.

The control circuit 26 is therefore adapted for determining in which sub-range is situated the frequency F measured by the frequency meter 161 and for determinng the connection of the capacitor of battery 12 assigned to this sub-range.

The whole range is broken down into sub-ranges so as to comply with the following criterion. In each sub-range, when the frequency differs from the central frequency $F_n$, parasite phase-shifts are introduced, particularly because the resonating circuit is not operating at its tuned frequency. The magnitude of these parasite phase-shifts may be determined by measuring the total parasite phase-shift appearing, in open loop, between the electromotive force induced into the semi-coils 181 and 182 and the voltage at the output of phase-shifter 28, i.e. between the signals picked up and the signals reinjected by the semi-coils 181 and 182. Breaking up into sub-ranges is carried out so that, within each sub-range, the parasite phase-shift measured in open loop remains less than a threshold. Here, and for example, the threshold is 20°. Generally, it is desirable for this threshold to remain less than about 30°.

It will be noted that, since the phase-shift introduced by the phase-shifter 28 remains in practice always equal to 90°, this phase-shifter introduces no parasite phase-shift.

Naturally, it is not absolutely necessary to have as many capacitors in the battery 12 as there are sub-ranges, suitable parallel connections of some of them making it possible to cover a wide range with a minimum number of capacitors.

The control circuit 26 is adapted for providing switching from one jointing sub-range to another throughout the measurement range, in tracking mode, as well as preselection at start-up, in the initialization mode of the magnetometer.

The level of the reinjection signal at the output of the controllable gain amplifier 30 is made dependent on the temperature through probe 34 which controls the value of the gain of amplifier 30. The law of variation of the level, as a function of the temperature, is such that it makes possible a reinjection level compatible with the signal picked up by the coils which depends on the temperature. For example, the level reinjected at +60° C. is substantially equal to half the level reinjected at −40° C., the variation between these two endmost temperatures being substantially linear.

Similarly, the reinjection level at the output of the controllable gain amplifier 30 is made dependent on the attitude of the measurement probe 101 with respect to the magnetic field to be measured, by means of sensor 36. This correction makes it possible to optimize the reinjection level with respect to the useful signal, picked up by coils 181 and 182.

Sensor 36 is a triaxial magnetometer of the "fluxgate" type, for example, which determines more particularly the angle α between the axis of symmetry of the measurement probe 1 and the magnetic field to be measured. It controls the gain of amplifier 30 so that the reinjected level, when angle $\alpha$ is equal to $+/-90°$ is 4 to 5 dB less than the reinjected level when the angle $\alpha$ is zero.

Similarly, the power of the VHF generator 14, for biasing the nuclear spins, is controlled by sensor 36 so as to offset the anisotropy of this biasing. Thus, sensor 36 controls this power so that its value, when the angle $\alpha$ is equal to $+/-90°$, is substantially equal to 0.7 times its value when the angle $\alpha$ is zero.

The output signal of phase-shifter 28 is used for causing a current feed-back in the circuit of the measurement semi-coils 181 and 182, because of the two resistors 381 and 382 through which feed-back currents flow in phase opposition. The linearization provided by such feed-back, while maintaining the signal to noise ratio, allows a greater phase margin in the oscillator and thus a better spread of the sub-ranges through the choice of capacitors 22.

The two semi-coils 181 and 182 are balanced during manufacture, and also because of the addition of the correction cell 42 disposed in series with one of the two coils.

This cell makes it possible to pair up the ohmic resistances of the coils through a series resistor 421 and to pair up the parasite capacities with respect to ground through a parallel capacitor 420.

The invention relates more particularly to spin coupling magnetometers for accurately measuring low magnetic fields such as the Earth's magnetic field whose value varies from 0.2 to 0.7 oersted and for detecting very low amplitude variations of these fields, of the order of $10^{-7}$ oersted for example.

Obviously, two jointing sub-ranges are, in fact, slightly oberlapping, and hysteresis is introduced in order to avoid erratic switching from one sub-range to the next, when the oscillations frequency is at the frontier between these two sub-ranges.

I claim:

1. Nuclear magnetic resonance magnetometer comprising two semi-coils for picking up and reinjecting precessional signals of the nuclear spins of two samples of a material having gyromagnetic properties, disposed in the magnetic field to be measured and energized by a VHF generator, including an oscillator comprising said two semi-coils, a capacitor connected to the terminals of the two semi-coils, and a differential amplifier connected to the terminals of the capacitor, a means for phase-shifting the output of said differential amplifier connected to the output of the differential amplifier, and means for reinjecting into each semi-coil a current controlled by the output signal from the phase-shifting means, and a frequency meter for measuring the frequency of the oscillations of said oscillator, which frequency is proportional to the magnetic field to be measured, wherein the phase-shifting means is adapted for introducing a constant phase-shift equal to 90° throughout the whole frequency range of the oscillatons, and wherein the capacitor forms part of a battery of capacitors and wherein means are provided for controlling the switching of the capacitors of said battery of capacitors in response to the value of the frequency measured by the frequency meter whereby parasite phase-shifts between the signals picked up and the signals reinjected into the two semi-coils always remain less than a predefined threshold.

2. Magnetometer according to claim 1, wherein, at the output of the phase-shifter, a controllable gain amplifier is provided connected to a temperature sensor for causing the level of the reinjected signals to vary depending on the temperature.

3. The magnetometer according to claim 1, wherein a sensor is provided for determining the attitude of the samples with respect to the magnetic field to be measured and a controllable gain amplifier is provided at the output of the phase-shifter, controlled by said attitude sensor and the VHF generator is power controllable, controlled by said attitude sensor.

* * * * *